(12) United States Patent
Rhodes

(10) Patent No.: US 6,821,852 B2
(45) Date of Patent: Nov. 23, 2004

(54) DUAL DOPED GATES

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 09/782,743

(22) Filed: Feb. 13, 2001

(65) Prior Publication Data

US 2002/0110986 A1 Aug. 15, 2002

(51) Int. Cl.[7] ............................. H01L 21/8234
(52) U.S. Cl. .................. 438/275; 438/199; 438/217
(58) Field of Search ................... 438/199, 217, 438/229, 275

(56) References Cited

U.S. PATENT DOCUMENTS

| | | | | |
|---|---|---|---|---|
| 4,450,021 A | * | 5/1984 | Batra et al. | |
| 5,106,768 A | * | 4/1992 | Kuo | |
| 5,173,438 A | | 12/1992 | Sandhu | 437/63 |
| 5,221,864 A | | 6/1993 | Galbi | 307/296.8 |
| 5,384,279 A | * | 1/1995 | Stolmeijer et al. | |
| 5,491,657 A | | 2/1996 | Haddad et al. | 365/185.27 |
| 5,718,800 A | | 2/1998 | Juengling | 156/643.1 |
| 5,723,357 A | * | 3/1998 | Huang | |
| 5,757,038 A | | 5/1998 | Tiwari et al. | 257/192 |
| 5,851,865 A | * | 12/1998 | Koike | |
| 5,856,945 A | | 1/1999 | Lee et al. | 365/185.3 |
| 6,010,925 A | * | 1/2000 | Hsieh | |
| 6,030,861 A | * | 2/2000 | Liu | |
| 6,043,533 A | * | 3/2000 | Gardner et al. | |
| 6,051,471 A | * | 4/2000 | Gardner et al. | |
| 6,060,345 A | * | 5/2000 | Hause et al. | |
| 6,258,647 B1 | * | 7/2001 | Lee et al. | |

OTHER PUBLICATIONS

Bude, J.,et al. ,"EEPROM/Flash Sub 3.0V Drain–Source Bias Hot Carrier Writing", *IEDM*, (1995),pp. 989–991.

Koike, H.,et al. ,"Process Simplification in Deep Submicron CMOS Fabrication", *IEEE—International Symposium on Semiconductor Manufacturing*, (1995),pp. 24–27.

Koike, H.,et al. ,"Simple and Quick Turnaround Time Fabrication Process for Deep Submicrometer CMOS Generation", *IEEE Transactions on Semiconductor Manufacturing*, 9(4), (1996), pp. 489–494.

* cited by examiner

*Primary Examiner*—Long Pham
(74) *Attorney, Agent, or Firm*—Schwegman, Lundberg, Woessner & Kluth, P.A.

(57) ABSTRACT

A method of forming an integrated circuit dual gate structure using only one mask is disclosed. In one embodiment, a substrate is prepared for the fabrication of a dual gate structure, a first gate structure having an NWELL is formed without using a mask, and a second gate structure having a PWELL is formed using only one mask. In an alternate embodiment, a substrate is prepared for the fabrication of a dual gate structure, a first gate structure having a PWELL is formed without using a mask, and a second gate structure having an NWELL is formed using only one mask.

11 Claims, 9 Drawing Sheets

DUAL DOPED GATES

FIELD OF THE INVENTION

This invention relates to integrated circuits and, more specifically, to methods of forming dual doped gate structures in an integrated circuit.

BACKGROUND OF THE INVENTION

As the density of devices, such as resistors, capacitors, and transistors, in an integrated circuit is increased, the processes for manufacturing the circuit become more complex, and in general, the number of manufacturing operations and mask steps required to fabricate the integrated circuit increases. The number of mask steps used to manufacture an integrated circuit is one measure of the complexity of the manufacturing process. Dual doped gate integrated circuit structures have been manufactured using four mask, three mask, and two mask processes.

FIGS. 1A–1D illustrate a prior art four mask process for manufacturing a dual doped gate circuit structure in a substrate 101. In a first masked implant operation, illustrated in FIG. 1A, an opening 103 in a resist structure 105 defines a first implant area in the substrate 101. A deep PWELL implant forms PWELL 107 and a shallow n-channel threshold voltage ($V_T$) adjust implant forms an n-channel threshold voltage ($V_T$) adjust area 109. In a second masked implant operation, illustrated in FIG. 1B, an opening 111 in a resist structure 113 defines a second implant area in the substrate 101. A deep NWELL implant forms an NWELL 115. A shallow p-channel threshold voltage ($V_T$) adjust implant forms a p-channel threshold voltage ($V_T$) adjust area 117. After the first and second masked implant operations, a sacrificial oxide 119 is removed from a surface of the substrate 101. A gate oxide layer 121 and a polysilicon gate layer 123 are formed on a surface of the substrate 101, as illustrated in FIG. 1C. In a third masked implant operation, illustrated in FIG. 1C, an opening 124 in a resist structure 125 defines a third implant area in the substrate 101. An $n^+$ implant forms an $n^+$ polysilicon region 127 in the polysilicon layer 123 over the PWELL 107. In a fourth masked implant operation, illustrated in FIG. 1D, an opening 129 in the resist structure 131 defines a fourth implant area in the substrate 101. A $p^+$ implant forms a $p^+$ polysilicon region in the polysilicon layer 133 over the NWELL 115.

FIGS. 2A–2D illustrate a prior art three mask process for manufacturing a dual doped gate circuit structure in a substrate 201. In a blanket implant operation, illustrated in FIG. 2A, a deep blanket PWELL implant forms a blanket PWELL 203 and a shallow blanket n-channel threshold voltage ($V_T$) adjust implant forms an n-channel threshold voltage ($V_T$) adjust area 205. In a first masked implant operation, illustrated in FIG. 2B, an opening 207 in a resist structure 209 defines an implant area in substrate 201. A deep NWELL implant forms an NWELL 211, and a shallow p-channel threshold voltage adjust implant forms p-channel threshold voltage ($V_T$) adjust area 213. After the first implant operation and the second masked implant operation, a sacrificial oxide layer 215 is removed from a surface of the substrate 201 and a gate oxide layer 217 and a polysilicon layer 219 are formed on the surface of the substrate 201. In a second masked implant operation, illustrated in FIG. 2C, an opening 220 in a resist structure 221 defines an implant area in substrate 201. An $n^+$ implant forms an $n^+$ polysilicon layer 225 over the PWELL 203. In the third masked implant operation, illustrated in FIG. 2D, an opening 227 in a resist structure 229 defines an implant area, and a $p^+$ implant forms a $p^+$ polysilicon 231 over the NWELL 211.

FIGS. 3A and 3B illustrate a prior art two mask process for manufacturing a dual doped gate circuit structure in a substrate 301. For a first masked implant operation, illustrated in FIG. 3A, an opening 303 in a resist structure 305 defines an implant area in substrate 301. The implant area includes a gate oxide layer 307 and a polysilicon layer 309 formed in the substrate 301. A deep p-type PWELL implant into the substrate 301 forms a PWELL 303, a shallow p-type threshold voltage ($V_T$) adjust implant into substrate 301 forms a shallow p-type threshold voltage ($V_T$) adjust region 311, and a shallow $n^+$ implant into the polysilicon layer 309 forms an $n^+$ polysilicon region 313 in the polysilicon layer 309. For a second masked implant operation, illustrated in FIG. 3B, an opening 315 in the resist structure 317 defines an implant area. The implant area includes the gate oxide layer 307 and the polysilicon layer 309 formed above the substrate 301. A deep n-type NWELL implant into the substrate 301 forms an NWELL 317, a shallow n-type threshold voltage ($V_T$) adjust implant into the substrate 301 forms a shallow n-type threshold voltage ($V_T$) adjust region 319, and a shallow $p^+$ implant into the polysilicon layer 309 forms a $p^+$ polysilicon region 321 in the polysilicon layer 309.

Unfortunately, each masking operation used in the manufacturing of the dual doped gate structure described above adds expense to the manufacturing process. The expense includes both the direct cost of the masking operation and the cost related to a longer manufacturing cycle.

For these and other reasons there is a need for the present invention.

SUMMARY OF THE INVENTION

The above mentioned problems with the fabrication of dual doped gates and other problems are addressed by the present invention and will be understood by reading and studying the following specification.

The present invention provides a method for forming an integrated circuit dual gate structure using only one mask. In one embodiment of the present invention, a substrate is prepared and one or more dual gate structures is formed in the substrate using only one mask. In an alternate embodiment of the present invention, a substrate is prepared, a first gate structure having a PWELL is formed without using a mask, and a second gate structure having an NWELL is formed using only one mask. In another alternate embodiment of the present invention, a substrate is prepared, a first gate structure having an NWELL is formed without using a mask, and a second gate structure having a PWELL is formed using only one mask.

These and other embodiments, aspects, advantages and features of the present invention will be set forth in part in the description which follows, and in part will become apparent to those skilled in the art by reference to the following description of the invention and referenced drawings or by practice of the invention. The aspects, advantages and features of the invention are realized and attained by means of the instrumentalities, procedures and combinations particularly pointed out in the appended claims.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. Also, in the following detailed description, the terms die and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is, therefore, not to be taken in a limiting sense, and the scope of the present invention is defined only by the appended claims.

When fabricated on a single substrate, an $n^+$ polysilicon gate suitable for use in connection with an n-channel metal-oxide semiconductor (PMOS) device and a $p^+$ polysilicon gate suitable for use in connection with a p-channel metal-oxide semiconductor (NMOS) device are known as dual doped gates.

Figure 1A:
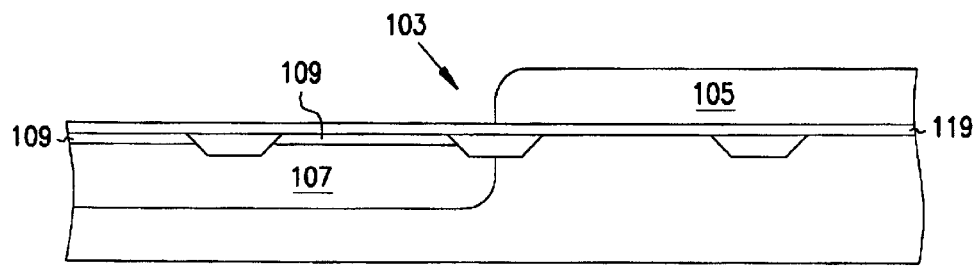
FIGS. 1A–1D illustrate cross-sectional views of a prior art dual doped gate circuit structure formed using four masking operations.
Figure 1B:
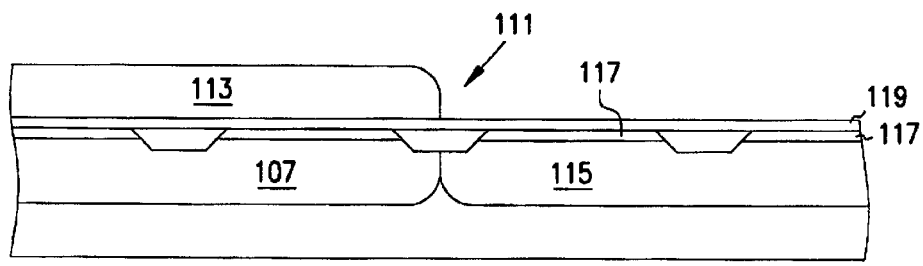
Figure 1C:
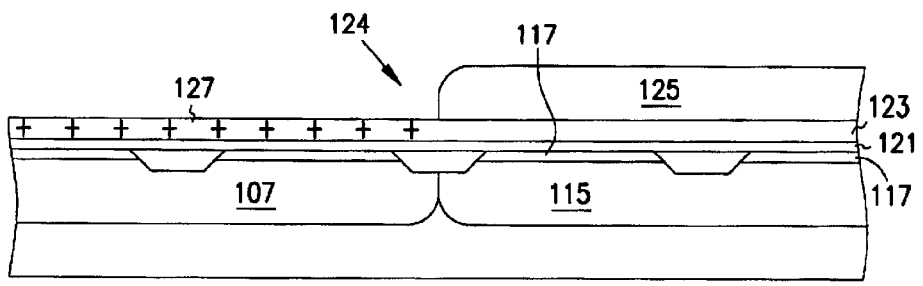
Figure 1D:
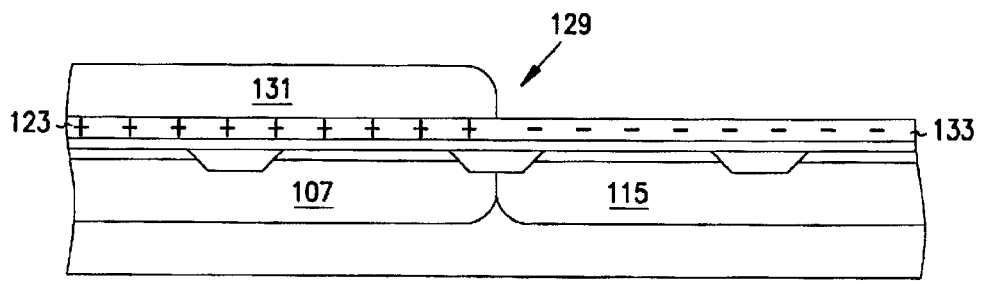
Figure 2A:
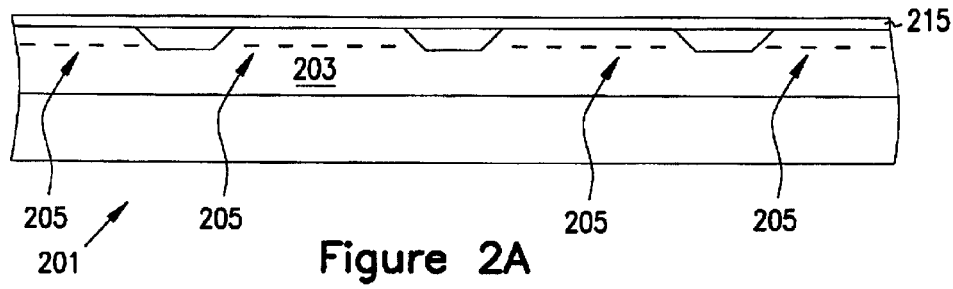
FIGS. 2A–2D illustrate cross-sectional views of a prior art dual doped gate circuit structure formed using three masking operations.
Figure 2B:
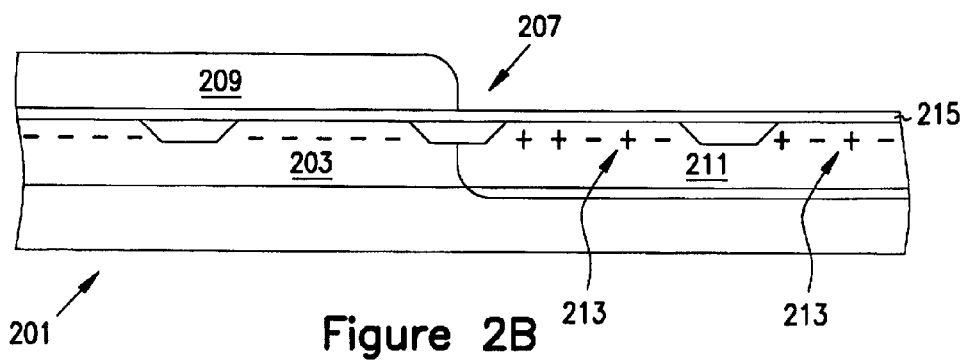
Figure 2C:
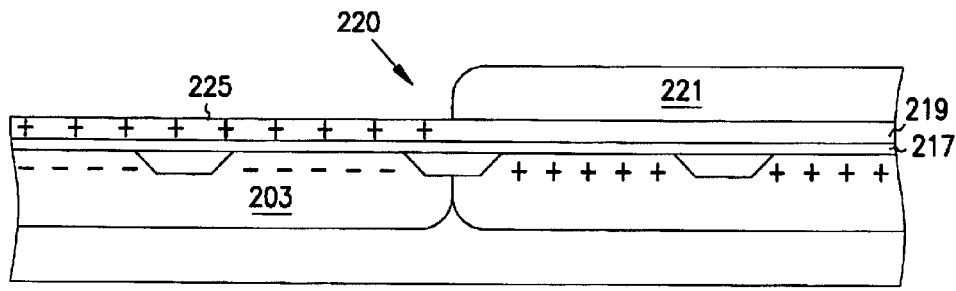
Figure 2D:
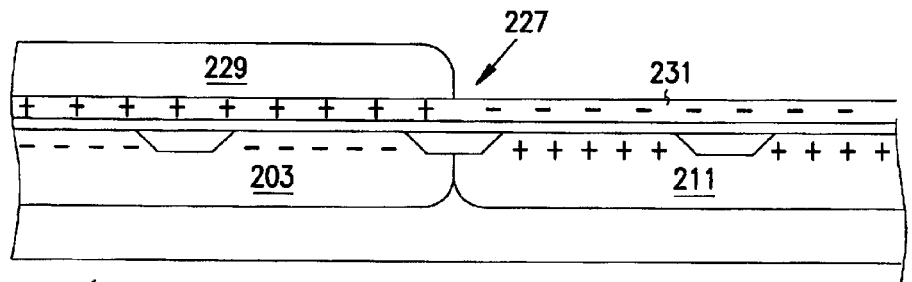
Figure 3A:
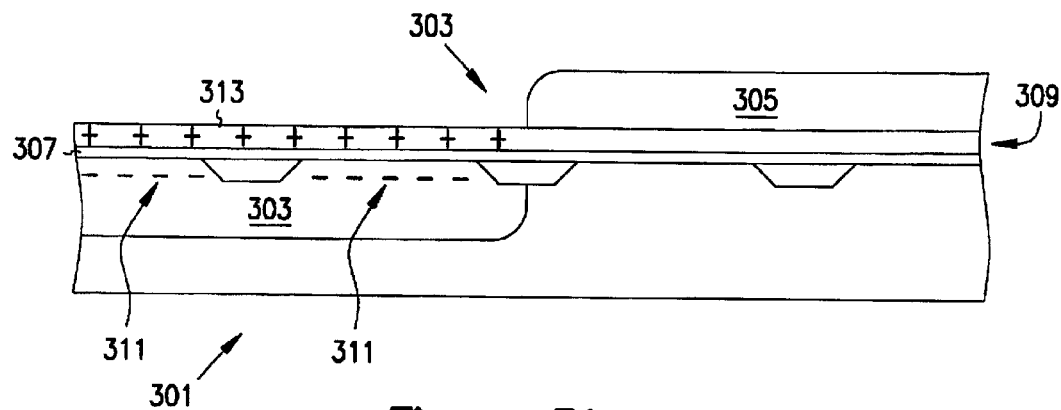
FIGS. 3A–3B illustrate cross-sectional views of a prior art dual doped gate circuit structure formed using two masking operations.
Figure 3B:
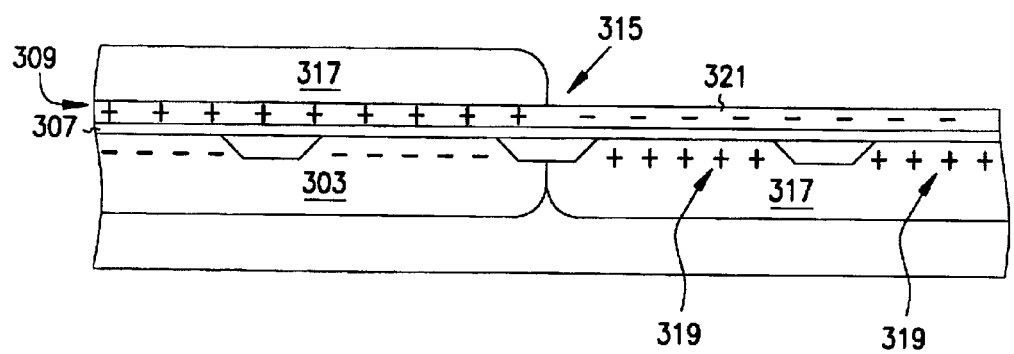
Figure 4A:
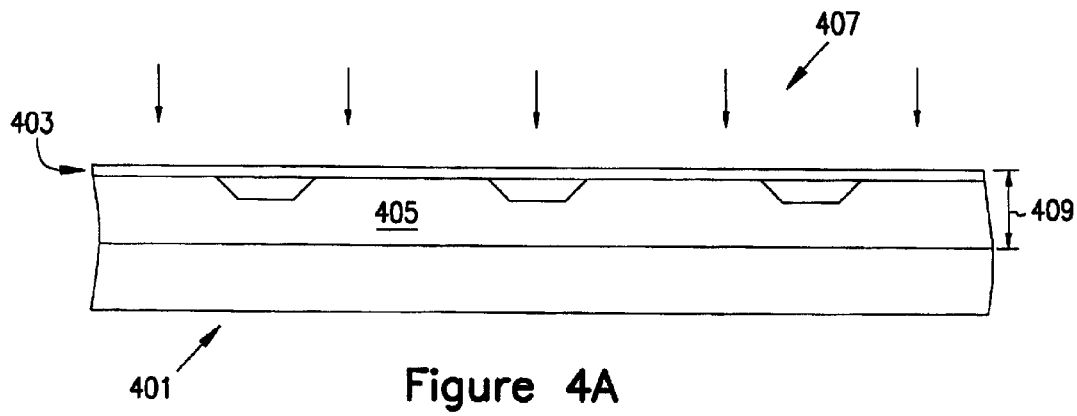
FIGS. 4A–4C illustrate, in a sequence of cross-sectional views, an example embodiment of a dual doped gate structure of the present invention formed using one masking operation after a blanket PWELL is formed through a sacrificial oxide.
Figure 4B:
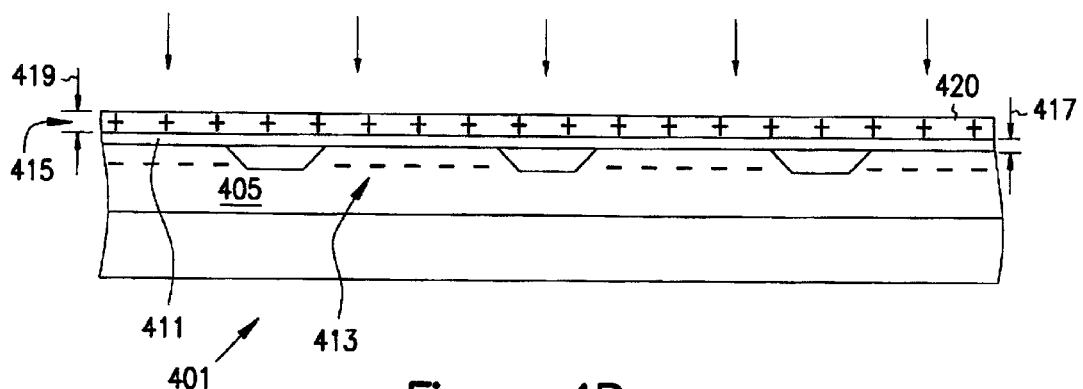
Figure 4C:
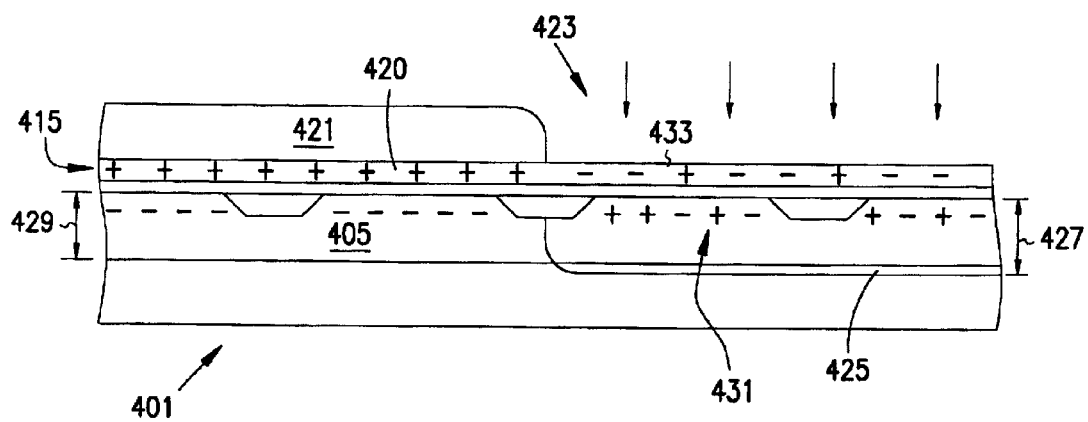

FIGS. 4A–4C illustrate, in a sequence of cross-sectional views, an example embodiment of a dual doped gate structure of the present invention formed using one masking operation after a blanket PWELL is formed through a sacrificial oxide.

In FIG. 4A, a cross-sectional view of a substrate 401 is shown after preparation of the substrate 401 for the fabrication of dual doped gates. The preparation of the substrate 401 includes forming a sacrificial oxide layer 403 and forming a PWELL 405 in an n-type substrate. The sacrificial oxide layer 403 is formed by growing an oxide to a thickness of a few microns. The PWELL 405 is formed by a blanket implant of ions into the substrate 401. The blanket implant introduces ions into the substrate 401 at an exposed substrate surface 407 and does not employ a mask. In one embodiment, the PWELL 405 is formed by a blanket implant of boron ions at about 430 keV into the substrate 401. The boron ions are preferably deposited to a depth 409 of about 200 nanometers at a density of about $2 \times 10^{23}$ atoms/cm$^3$. However, the present invention is not limited to a blanket implant of boron ions. Any implantable material capable of forming a PWELL, when introduced into the substrate 401, is suitable for use in connection with the present invention. A blanket implant is preferable to a masked operation, such as a masked implant, a masked diffusion, or a masked deposition because the blanket implant is less costly.

In FIG. 4B, a cross-sectional view of the substrate 401 is shown after the sacrificial oxide 403, shown in FIG. 4A, is removed. FIG. 4B shows a gate oxide layer 411 formed on the substrate 401, a threshold voltage ($V_T$) adjust region 413 formed in the substrate 401, and a polysilicon layer 415 formed on the gate oxide layer 411.

After removing the sacrificial oxide layer 403 shown in FIG. 4A, the gate oxide layer 411 is formed on the substrate 401, as shown in FIG. 4B. The gate oxide layer 411 preferably has a thickness 417 of between about five nanometers and about ten nanometers. A thickness of greater than about ten nanometers interferes with the injection of electrons into the polysilicon layer, and a thickness of less than about five nanometers unnecessarily increases the probability of voids and fractures in the oxide layer. Since the appropriate thickness for the gate oxide layer 411 depends on the particular integrated circuit device into which the gate oxide layer 411 is incorporated, the thickness 417 of the gate oxide layer 411 is usually determined empirically or by modeling.

The polysilicon layer 415 is formed above the gate oxide layer 411 and has a thickness 419 of between about 20 nanometers and about 200 nanometers. The polysilicon layer 415 is typically formed by chemical vapor deposition. The stray capacitance between the polysilicon layer 415 and conductive layers in adjacent devices (not shown) increases as the polysilicon layer thickness 419 increases. If the thickness 419 of the polysilicon layer 415 is more than about 200 nanometers, the stray capacitance between the polysilicon layer 415 and the conductive layers in adjacent devices (not shown) is usually unacceptably high.

The blanket p-type threshold voltage ($V_T$) adjust region 413 is formed by a blanket implant into the substrate 401. The $V_T$ adjust region 413 is formed in the PWELL 405 by implanting ions into the PWELL 405. In one embodiment, the V$_T$ adjust region 413 is formed by implanting phosphorous ions at about 430 keV to a density of about 2×10$^{23}$ atoms/cm$^3$ into the PWELL 405. The phosphorous ions are preferably implanted to a depth of between about 75 nanometers and about 100 nanometers.

After the blanket threshold voltage (V$_T$) adjust region 413 is formed as described above, a doped polysilicon layer 420 is formed by an n$^+$ blanket implant into the polysilicon layer 415. Exemplary materials suitable for use as an n$^+$ blanket implant include phosphorous, arsenic, or antimony ions. In one embodiment, the doped polysilicon layer 420 is formed by a blanket implant of phosphorous ions at about 430 keV deposited to a density of about 2×10$^{23}$ atoms/cm$^3$. The doped polysilicon layer 415 can function as a gate in a metal-oxide semiconductor device, such as an NMOS device.

Referring to FIG. 4C, a resist layer 421 is formed on the doped polysilicon layer 420. The resist layer 421 is patterned to form an NWELL mask defining one or more NWELL regions 423. In one embodiment, at least one of the one or more NWELL regions 423 has a substantially rectangular shape, when viewed from above (not shown).

A deep NWELL 425 is formed by introducing ions into the NWELL region 423. The deep NWELL 425 preferably has a depth 427 greater than the depth 429 of the PWELL 405. In one embodiment, the deep NWELL 425 is formed by implanting phosphorous ions at about 860 keV to a depth of between about 220 nanometers and about 240 nanometers at a density of about 2×10$^{23}$ atoms/cm$^3$.

An n-type threshold voltage (V$_T$) adjust region 431 is formed by introducing ions into the NWELL 425. In one embodiment, the V$_T$ adjust region 431 is formed by implanting boron ions at about 430 keV to a density of about 2×10$^{23}$ atoms/cm$^3$ into the NWELL 425. The boron ions are preferably implanted to a depth of between about 75 nanometers and about 100 nanometers.

After the n-type threshold voltage (V$_T$) adjust region 431 is formed as described above, a p$^+$ polysilicon layer 433 is formed by a p$^+$ implant into the NWELL region 423 of the doped polysilicon layer 420. The doped polysilicon layer 420 in the NWELL region 423 is transformed into a p$^+$ polysilicon layer 433 by introducing a dopant into the doped polysilicon layer 420. In one embodiment, the p$^+$ polysilicon layer 433 is formed by implanting boron ions at about 430 keV to a density of about 2×10$^{23}$ atoms/cm$^3$ into the NWELL region 423. The p$^+$ polysilicon layer 433 can function as a gate in a metal-oxide semiconductor device, such as a PMOS device.

Figure 5A:
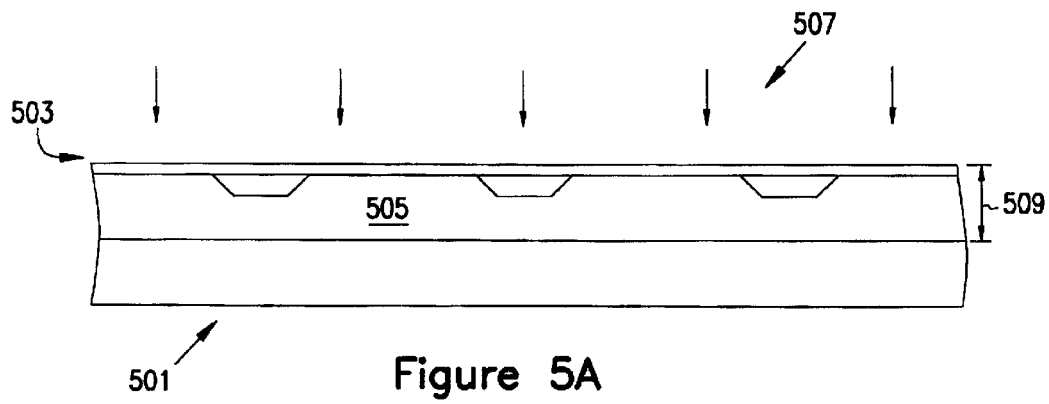
FIGS. 5A–5C illustrate, in a sequence of cross-sectional views, an example embodiment of a dual doped gate structure of the present invention formed using one masking operation after a blanket NWELL is formed through a sacrificial oxide.
Figure 5B:
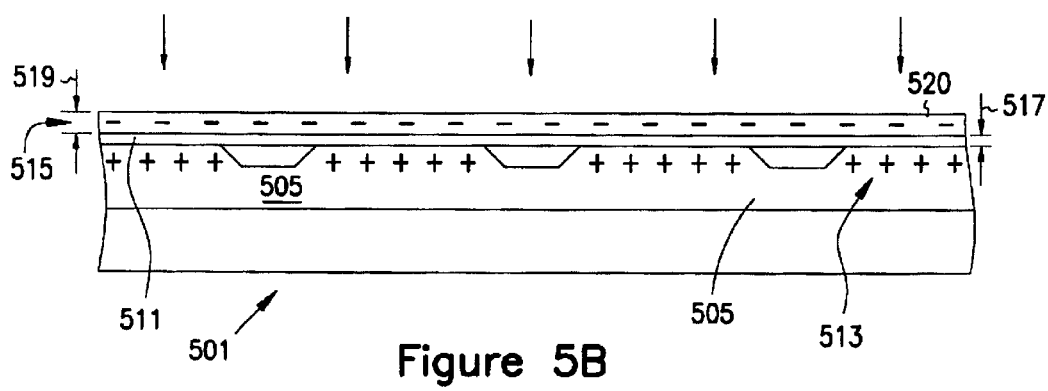
Figure 5C:
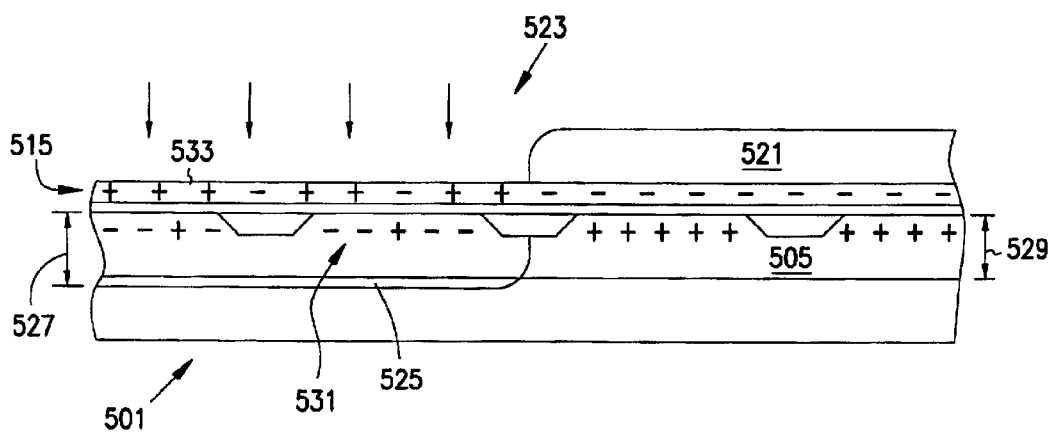

FIGS. 5A–5C illustrate, in a sequence of cross-sectional views, an example embodiment of a dual doped gate structure of the present invention formed using one masking operation after a blanket NWELL is formed through a sacrificial oxide.

In FIG. 5A, a cross-sectional view of a substrate 501 is shown after preparation of the substrate 501 for the fabrication of dual doped gates. The preparation of the substrate 501 includes forming a sacrificial oxide layer 503 and forming an NWELL 505 in a p-type substrate. The sacrificial oxide layer 503 is formed by growing an oxide to a thickness of a few microns. The NWELL 505 is formed by a blanket implant of ions into the substrate 501. The blanket implant introduces ions into the substrate 501 at an exposed substrate surface 507 and does not employ a mask. In one embodiment, the NWELL 505 is formed in the substrate 501 by a blanket implant of phosphorous ions at about 430 keV. The phosphorous ions are preferably deposited to a depth 509 of about 200 nanometers at a density of about 2×10$^{23}$ atoms/cm$^3$. However, the present invention is not limited to a blanket implant of phosphorous ions. Any implantable material capable of forming an NWELL, when implanted into the substrate 501, is suitable for use in connection with the present invention. A blanket implant is preferable to a masked operation, such as a masked implant, a masked diffusion, or a masked deposition because the blanket implant is less costly.

In FIG. 5B, a cross-sectional view of the substrate 501 is shown after the sacrificial oxide 503, shown in FIG. 5A, is removed. FIG. 5B shows a gate oxide layer 511 formed on the substrate 501, a threshold voltage (V$_T$) adjust region 513 formed in the substrate 501, and a doped polysilicon layer 515 formed on the gate oxide layer 511.

After removing the sacrificial oxide layer 503 shown in FIG. 5A, the gate oxide layer 511 is formed on the substrate 501, as shown in FIG. 5B. The gate oxide layer 511 preferably has a thickness 517 of between about five nanometers and about ten nanometers. A thickness of greater than about ten nanometers interferes with the injection of electrons into the polysilicon layer, and a thickness of less than about five nanometers unnecessarily increases the probability of voids and fractures in the oxide layer. Since the appropriate thickness for the gate oxide layer 511 depends on the particular integrated circuit device into which the gate oxide layer 511 is incorporated, the thickness 517 of the gate oxide layer 511 is usually determined empirically or by modeling.

The polysilicon layer 515 is formed above the gate oxide layer 511 and has a thickness 519 of between about 20 nanometers and about 200 nanometers. The polysilicon layer 515 is typically formed by chemical vapor deposition. The stray capacitance between the polysilicon layer 515 and conductive layers in adjacent devices (not shown) increases as the polysilicon layer thickness 519 increases. If the thickness 519 of the polysilicon layer 515 is more than about 200 nanometers, the stray capacitance between the polysilicon layer 515 and the conductive layers in adjacent devices (not shown) is usually unacceptably high.

The blanket n-type threshold voltage (V$_T$) adjust region 513 is formed by a blanket implant into the substrate 501. The V$_T$ adjust region 513 is formed in the NWELL 505 by implanting ions into the NWELL 505. In one embodiment, the V$_T$ adjust region 513 is formed by implanting boron ions at about 530 keV to a density of about 2×10$^{23}$ atoms/cm$^3$ into the NWELL 505. The boron ions are preferably implanted to a depth of between about 75 nanometers and about 100 nanometers.

After the blanket threshold voltage (V$_T$) adjust region 513 is formed as described above, the doped polysilicon layer 520 is formed by a p$^+$ blanket implant into the polysilicon layer 515. In one embodiment, the doped polysilicon layer 520 is formed by a blanket implant of boron ions at about 530 keV deposited to a density of about 2×10$^{23}$ atoms/cm$^3$. The doped polysilicon layer 520 can function as a gate in a metal-oxide semiconductor device, such as an PMOS device.

Referring to FIG. 5C, a resist layer 521 is formed on the doped polysilicon layer 520. The resist layer 521 is patterned to form a PWELL mask defining one or more PWELL regions 523. In one embodiment, at least one of the one or more PWELL regions 523 has a substantially rectangular shape, when viewed from above (not shown).

A deep PWELL 525 is formed by introducing ions into the PWELL region 523. The deep PWELL 525 preferably has a depth 527 greater than the depth 529 of the NWELL 505. In one embodiment, the deep PWELL 525 is formed by implanting boron ions at about 860 keV to a depth of between about 220 nanometers and about 240 nanometers at a density of about $2 \times 10^{23}$ atoms/cm$^3$.

An p-type threshold voltage ($V^T$) adjust region 531 is formed by introducing ions into the PWELL 525. In one embodiment, the $V_T$ adjust region 531 is formed by implanting phosphorous ions at about 530 keV to a density of about $2 \times 10^{23}$ atoms/cm$^3$ into the PWELL 525. The phosphorous ions are preferably implanted to a depth of between about 75 nanometers and about 100 nanometers.

After the p-type blanket threshold voltage ($V_T$) adjust region 531 is formed as described above, an n$^+$ polysilicon layer 533 is formed by an n$^+$ implant into the PWELL region 523 of the doped polysilicon layer 520. The doped polysilicon layer 520 in the PWELL region 523 is transformed into an n$^+$ polysilicon layer 533 by introducing a dopant, such as phosphorous ions, into the doped polysilicon layer 520. In one embodiment, the doped polysilicon layer 520 is transformed in the n$^+$ polysilicon layer 533 by implanting phosphorous ions at about 430 keV to a density of about $2 \times 10^{23}$ atoms/cm$^3$ into the PWELL region 523. The n$^+$ polysilicon layer 533 can function as a gate in a metal-oxide semiconductor device, such as a PMOS device.

Figure 6A:
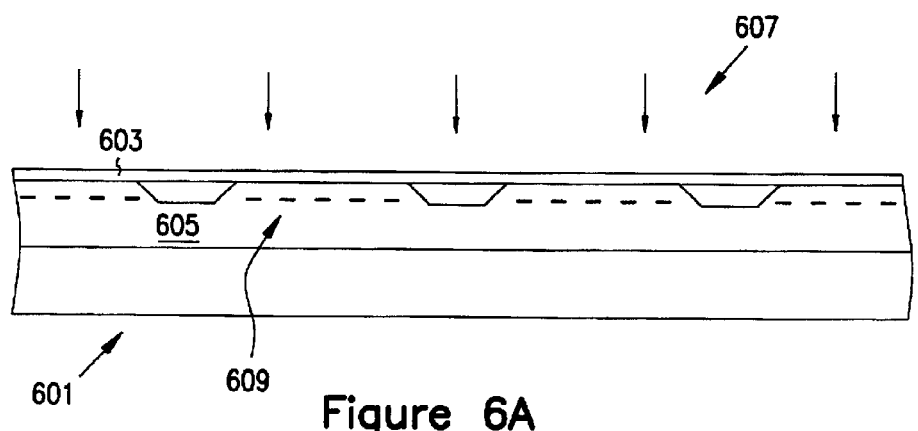
FIGS. 6A–6C illustrate, in a sequence cross-sectional views, an example embodiment of a dual doped gate circuit structure of the present invention formed using one masking operation after a blanket PWELL and a blanket threshold voltage ($V_T$) adjust implant are formed through a sacrificial oxide.
Figure 6B:
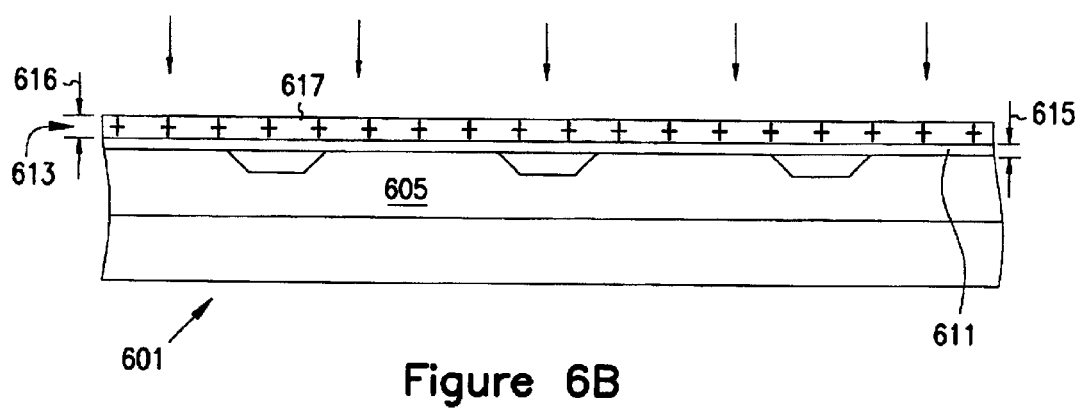
Figure 6C:
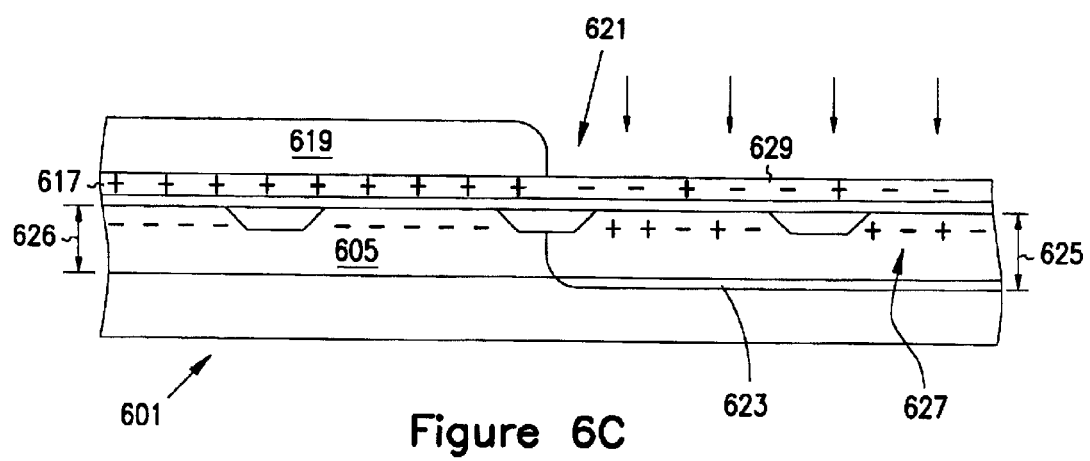

FIGS. 6A–6C illustrate, in a sequence cross-sectional views, an example embodiment of a dual doped gate circuit structure of the present invention formed using one masking operation after a blanket PWELL and a blanket threshold voltage ($V_T$) adjust implant are formed through a sacrificial oxide.

In FIG. 6A, a cross-sectional view of the substrate 601 is shown after preparation for the fabrication of dual doped gates. The preparation of the substrate 601 includes forming a sacrificial oxide layer 603 and forming a PWELL 605. The sacrificial oxide layer 603 is formed by growing an oxide on the substrate 601 to a thickness of a few microns. The PWELL 605 is formed by a blanket implant of ions into the substrate 601. The blanket implant introduces ions into the substrate 601 at an exposed substrate surface 607 and does not employ a mask. In one embodiment, the PWELL 605 is formed by a blanket implant of boron ions at about 430 keV into the substrate 601. The boron ions are preferably deposited to a depth of about 200 nanometers at a density of about $2 \times 10^{23}$ atoms/cm$^3$. However, the present invention is not limited to a blanket implant of boron ions. Any implantable material capable of forming a PWELL, when implanted into the substrate 601, is suitable for use in connection with the present invention. A blanket implant is preferable to a masked operation, such as a masked implant, a masked diffusion, or a masked deposition because the blanket implant is less costly.

A blanket threshold voltage ($V_T$) adjust region 609 is formed by a blanket implant into the substrate 601. The $V_T$ adjust region 609 is formed in the PWELL 605 by implanting ions into the PWELL 605. In one embodiment, the $V_T$ adjust region 609 is formed by implanting phosphorous ions at about 430 keV to a density of about $2 \times 10^{23}$ atoms/cm$^3$ into the PWELL 605. The phosphorous ions are preferably implanted to a depth of between about 75 nanometers and about 100 nanometers.

In FIG. 6B, a cross-sectional view of the substrate 601 is shown after the sacrificial oxide 603, shown in FIG. 6A, is removed. FIG. 6B shows a gate oxide layer 611 formed on the substrate 601 and a polysilicon layer 613 formed on the gate oxide layer 611.

After removing the sacrificial oxide layer 603, shown in FIG. 6A, the gate oxide layer 611 is formed on the substrate 601, as shown is FIG. 6B. The gate oxide layer 611 preferably has a thickness 615 of between about five nanometers and about ten nanometers. A thickness of greater than about ten nanometers interferes with the injection of electrons into the polysilicon layer, and a thickness of less than about five nanometers unnecessarily increases the probability of voids and fractures in the gate oxide layer 611. Since the appropriate thickness for the gate oxide layer 611 depends on the particular integrated circuit device into which the gate oxide layer 611 is incorporated, the thickness 615 of the gate oxide layer 611 is best determined empirically or by modeling.

The polysilicon layer 613 is formed above the gate oxide layer 611 and has a thickness 616 of between about 20 nanometers and about 200 nanometers. The polysilicon layer 613 is typically formed by chemical vapor deposition. The stray capacitance between the polysilicon layer 613 and conductive layers in adjacent devices (not shown) increases as the thickness 616 increases. If the polysilicon layer 613 has a thickness 616 of more than about 200 nanometers, the stray capacitance between the polysilicon layer 613 and the conductive layers in adjacent devices (not shown) is usually unacceptably high.

After the polysilicon layer 613 is formed as described above, the polysilicon layer 613 is transformed into a doped or n$^+$ polysilicon layer 617 by introducing a dopant into the polysilicon layer 613. In one embodiment, the doped or n$^+$ polysilicon layer 617 is formed by a blanket implant of phosphorous ions at about 430 keV to a density of about $2 \times 10^{23}$ atoms/cm$^3$. The doped or n$^+$ polysilicon layer 617 can function as a gate in a metal-oxide semiconductor device, such as an NMOS device.

Referring to FIG. 6C, a resist layer 619 is formed on the polysilicon layer 617. The resist layer 619 is patterned to form an NWELL mask defining one or more NWELL regions 621. In one embodiment, at least one of the one or more NWELL regions 621 has a substantially rectangular shape when viewed from above (not shown).

A deep NWELL 623 is formed by introducing ions into one or more of the NWELL regions 621. The deep NWELL 623 preferably has a depth 625 greater than the depth 626 of the blanket PWELL 605. In one embodiment, the deep NWELL 623 is formed by implanting phosphorous ions at about 860 keV to a depth of between about 220 nanometers and about 240 nanometers to a density of about $2 \times 10^{23}$ atoms/cm$^3$.

A threshold voltage ($V_T$) adjust region 627 is formed by introducing ions into the NWELL 623. In one embodiment, the $V_T$ adjust region 627 is formed by implanting boron ions at about 430 keV to a density of about $2 \times 10^{23}$ atoms/cm$^3$ into the NWELL 623. The boron ions are preferably implanted to a depth of between about 75 nanometers and about 100 nanometers.

After the blanket threshold voltage ($V_T$) adjust region 627 is formed as described above, a p$^+$ polysilicon layer 629 is formed by a p$^+$ implant into the NWELL region of the polysilicon layer 617. The polysilicon layer 617 is transformed into the p$^+$ polysilicon layer 629 by introducing a dopant into the polysilicon layer 629. In one embodiment, the p$^+$ polysilicon layer 629 is formed by implanting boron ions at about 430 keV to a density of about $2 \times 10^{23}$ atoms/cm$^3$. The p$^+$ polysilicon layer 629 can function as a gate in a metal-oxide semiconductor device, such as a PMOS device.

Figure 7A:
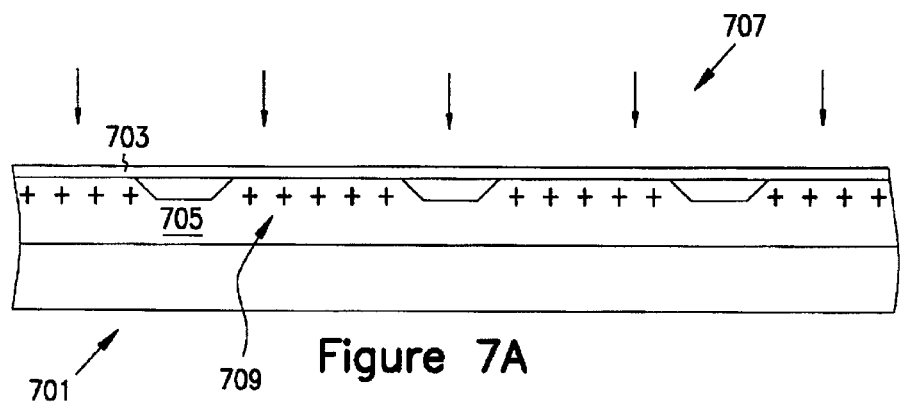
FIGS. 7A–7C illustrate, in a sequence of cross-sectional views, an example embodiment of a dual doped gate circuit structure of the present invention formed using one masking operation after a blanket NWELL and a blanket threshold voltage ($V_T$) adjust implant are formed through a sacrificial oxide.
Figure 7B:
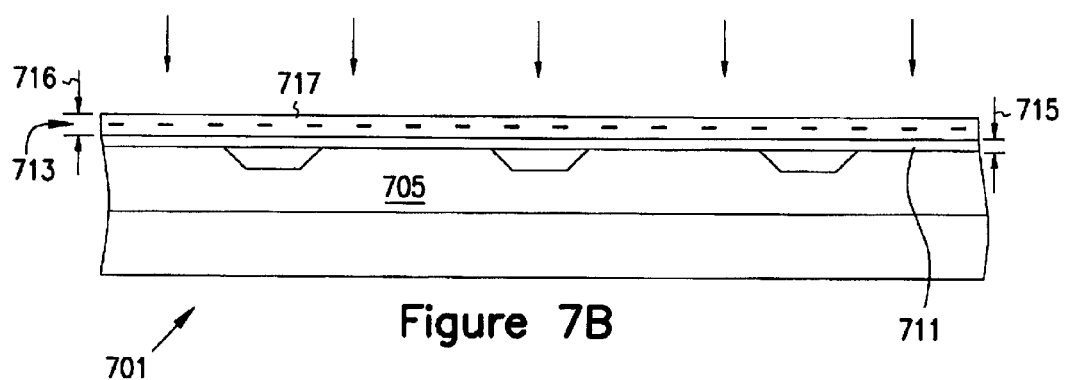
Figure 7C:
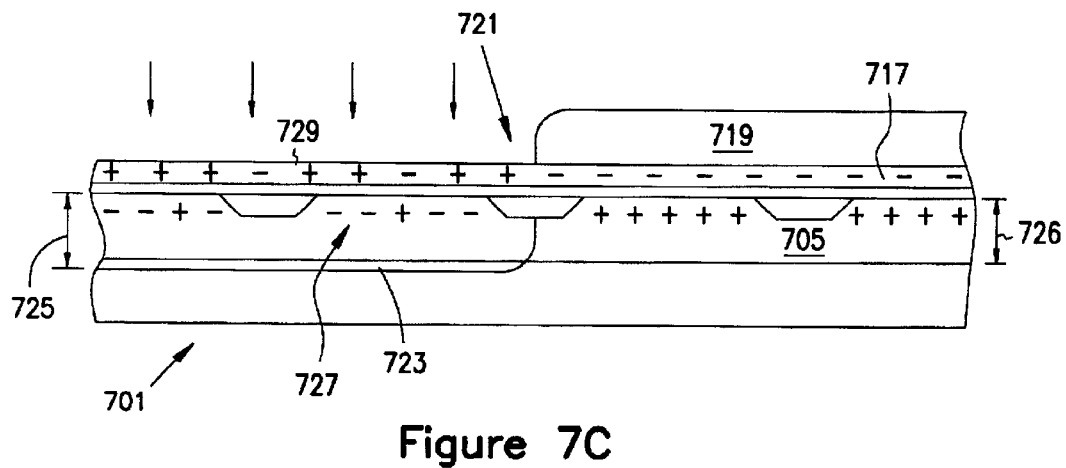

FIGS. 7A–7C illustrate, in a sequence of cross-sectional views, an example embodiment of a dual doped gate circuit structure of the present invention formed using one masking operation after a blanket NWELL and a blanket threshold voltage ($V_T$) adjust implant are formed through a sacrificial oxide.

In FIG. 7A, a cross-sectional view of the substrate 701 is shown after preparation for the fabrication of dual doped gates. The preparation of the substrate 701 includes forming a sacrificial oxide layer 703 and forming an NWELL 705. The sacrificial oxide layer 703 is formed by growing an oxide to a thickness of a few microns. The NWELL 705 is formed by a blanket implant of ions into the substrate 701. The blanket implant introduces ions into the substrate 701 at an exposed substrate surface 707 and does not employ a mask. In one embodiment, the NWELL 705 is formed by a blanket implant of phosphorous ions at about 430 keV into the substrate 701. The phosphorous ions are preferably deposited to a depth of about 200 nanometers at a density of about $2\times10^{23}$ atoms/cm$^3$. However, the present invention is not limited to a blanket implant of phosphorous ions. Any implantable material capable of forming an NWELL, when implanted into the substrate 701, is suitable for use in connection with the present invention. A blanket implant is preferable to a masked operation, such as a masked implant, a masked diffusion, or a masked deposition because the blanket implant is less costly.

A blanket threshold voltage ($V_T$) adjust region 709 is formed by a blanket implant into the substrate 701. The $V_T$ adjust region 709 is formed in the NWELL 705 by implanting ions into the NWELL 705. In one embodiment, the $V_T$ adjust region 709 is formed by implanting boron ions at about 430 keV to a density of about $2\times10^{23}$ atoms/cm$^3$ into the NWELL 705. The boron ions are preferably implanted to a depth of between about 75 nanometers and about 100 nanometers.

In FIG. 7B, a cross-sectional view of the substrate 701 is shown after the sacrificial oxide 703, shown in FIG. 7A, is removed. FIG. 7B shows a gate oxide layer 711 formed on the substrate 701 and a doped polysilicon layer 713 formed on the gate oxide layer 711.

After removing the sacrificial oxide layer 703, shown in FIG. 7A, the gate oxide layer 711 is formed on the substrate 701, as shown is FIG. 7B. The gate oxide layer 711 preferably has a thickness 715 of between about five nanometers and about ten nanometers. A thickness of greater than about ten nanometers interferes with the injection of electrons into the polysilicon layer, and a thickness of less than about five nanometers unnecessarily increases the probability of voids and fractures in the gate oxide layer 711. Since the appropriate thickness for the gate oxide layer 711 depends on the particular integrated circuit device into which the gate oxide layer 711 is incorporated, the thickness 715 of the gate oxide layer 711 is best determined empirically or by modeling.

The polysilicon layer 713 is formed above the gate oxide layer 711 and has a thickness 716 of between about 20 nanometers and about 200 nanometers. The polysilicon layer 713 is typically formed by chemical vapor deposition. The stray capacitance between the polysilicon layer 713 and conductive layers in adjacent devices (not shown) increases as the thickness 715 increases. If the polysilicon layer 713 has a thickness of more than about 200 nanometers, the stray capacitance between the polysilicon layer 713 and the conductive layers in adjacent devices (not shown) is usually unacceptably high.

After the polysilicon layer 713 is formed as described above, the polysilicon layer 713 is transformed into a doped or p$^+$ polysilicon layer 717 by introducing a dopant into the polysilicon layer 713. In one embodiment, the doped or p$^+$ polysilicon layer 717 is formed by a blanket implant of boron ions at about 430 keV to a density of about $2\times10^{23}$ atoms/cm$^3$. The doped or p$^+$ polysilicon layer 717 can function as a gate in a metal-oxide semiconductor device, such as an NMOS device.

Referring to FIG. 7C, a resist layer 719 is formed on the polysilicon layer 717. The resist layer 719 is patterned to form an PWELL mask defining one or more PWELL regions 721. In one embodiment, at least one of the one or more PWELL regions 721 has a substantially rectangular shape, when viewed from above (not shown).

A deep PWELL 723 is formed by introducing ions into one or more of the PWELL regions 721. The deep PWELL 723 preferably has a depth 725 greater than the depth 726 of the blanket NWELL 705. In one embodiment, the deep PWELL 723 is formed by implanting boron ions at about 860 keV to a depth of between about 220 nanometers and about 240 nanometers at a density of about $2\times10^{23}$ atoms/cm$^3$.

An threshold voltage ($V_T$) adjust region 727 is formed by introducing ions into the PWELL 723. In one embodiment, the $V_T$ adjust region 727 is formed by implanting phosphorous ions at about 430 keV to a density of about $2\times10^{23}$ atoms/cm$^3$ into the PWELL 723. The boron ions are preferably implanted to a depth of between about 75 nanometers and about 100 nanometers.

After the blanket threshold voltage ($V_T$) adjust region 727 is formed as described above, an n$^+$ polysilicon layer 729 is formed by an n$^+$ implant into the PWELL region of the polysilicon layer 717. The polysilicon layer 717 is transformed into the n+polysilicon layer 729 by introducing a dopant into the polysilicon layer 729. In one embodiment, the n$^+$ polysilicon layer 729 is formed by implanting phosphorous ions at about 430 keV to a density of about $2\times10^{23}$ atoms/cm$^3$. The n$^+$ polysilicon layer 729 can function as a gate in a metal-oxide semiconductor device, such as an NMOS device.

Figure 8A:
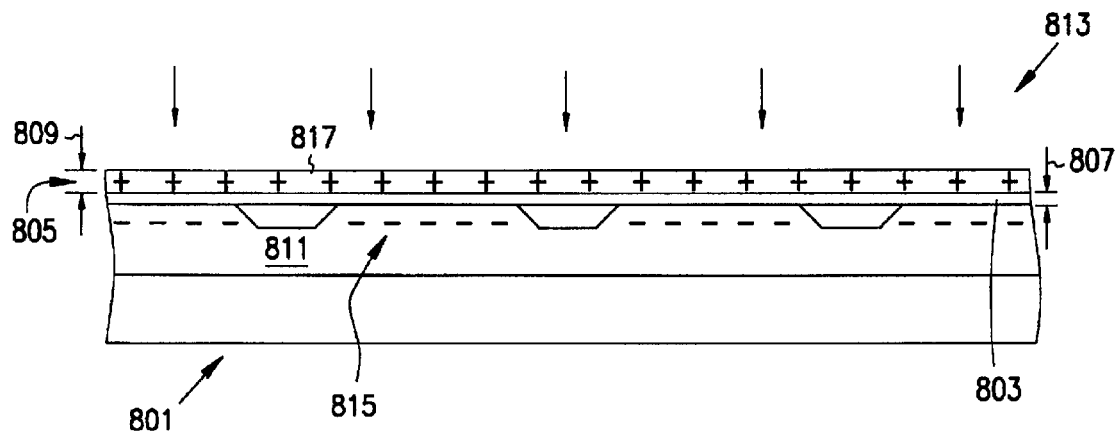
FIGS. 8A–8B illustrate, in a sequence of cross-sectional views, an example embodiment of a dual doped gate circuit structure of the present invention formed using one masking operation after performing a number of blanket implants including a PWELL implant.
Figure 8B:
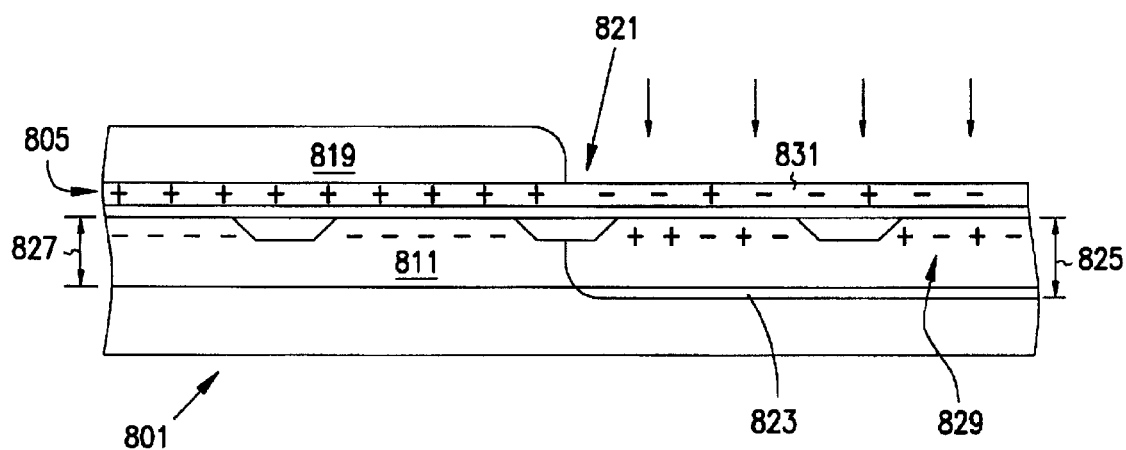

FIGS. 8A–8B illustrate, in a sequence of cross-sectional views, an example embodiment of a dual doped gate circuit structure of the present invention formed using one masking operation after performing a number of blanket implants including a PWELL implant.

FIG. 8A shows a gate oxide layer 803 formed on the substrate 801 and a polysilicon layer 805 formed on the gate oxide layer 803. The gate oxide layer 803 preferably has a thickness 807 of between about five nanometers and about ten nanometers. A thickness of greater than about ten nanometers interferes with the injection of electrons into the polysilicon layer 805, and a thickness of less than about five nanometers unnecessarily increases the probability of voids and fractures in the oxide layer. Since the appropriate thickness for the gate oxide 803 layer depends on the particular integrated circuit device into which the gate oxide layer 803 is incorporated, the thickness 807 of the gate oxide layer 803 is best determined empirically or by modeling.

The polysilicon layer 805 is formed above the gate oxide layer 803 and has a thickness 809 of between about 20 nanometers and about 200 nanometers. The polysilicon layer 805 is typically formed by chemical vapor deposition. The stray capacitance between the polysilicon layer 805 and conductive layers in adjacent devices (not shown) increases as the polysilicon layer thickness 809 increases. For the polysilicon layer 805 having a thickness of more than about 200 nanometers, the stray capacitance between the polysilicon layer 805 and the conductive layers in adjacent devices (not shown) is usually unacceptably high.

A PWELL 811 is formed by a blanket implant of ions into the substrate. The blanket implant introduces ions into the substrate at an exposed substrate surface 813 and does not employ a mask. In one embodiment, the PWELL 811 is formed by a blanket implant of phosphorous ions at about 430 keV into the substrate. The phosphorous ions are preferably deposited to a depth of about 200 nanometers at a density of about $2 \times 10^{23}$ atoms/cm$^3$. However, the present invention is not limited to a blanket implant of phosphorous ions. Any implantable material capable of forming a PWELL, when implanted into the substrate 801, is suitable for use in connection with the present invention. A blanket implant is preferable to a masked operation, such as a masked implant, a masked diffusion, or a masked deposition because the blanket implant is less costly.

A blanket threshold voltage ($V_T$) adjust 815 is formed by a blanket implant into the substrate 801. The $V_T$ adjust 815 is formed in the PWELL 811 by implanting ions into the PWELL 811. In one embodiment, the $V_T$ adjust 815 is formed by implanting phosphorous ions at about 430 keV to a density of about $2 \times 10^{23}$ atoms/cm$^3$ into the PWELL 811. The phosphorous ions are preferably implanted to a depth of between about 75 nanometers and about 100 nanometers.

After the blanket threshold voltage ($V_T$) adjust 815 is formed as described above, the polysilicon layer 805 is transformed in a doped or an n$^+$ polysilicon layer 817 by a blanket implant into the polysilicon layer 805. The blanket implant introduces a dopant, such as phosphorous, arsenic, or antimony ions, into the polysilicon layer 805. In one embodiment, the doped or n$^+$ polysilicon layer 817 is formed by a blanket implant of phosphorous ions at about 430 keV deposited to a density of about $2 \times 10^{23}$ atoms/cm$^3$. The n$^+$ polysilicon layer 817 can function as a gate in a metal-oxide semiconductor device, such as an NMOS device.

Referring to FIG. 8B, a resist layer 819 is formed on the polysilicon layer 805. The resist layer 819 is patterned to form an NWELL mask defining one or more NWELL regions 821. In one embodiment, at least one of the one or more NWELL regions 821 has a substantially rectangular shape, when viewed from above (not shown).

A deep NWELL 823 is formed by introducing ions into at least one of the one or more NWELL regions 821. The deep NWELL 823 preferably has a depth 825 greater than a depth 827 of the blanket PWELL 811. In one embodiment, the deep NWELL 823 is formed by implanting phosphorous ions at about 860 keV to a depth of between about 220 nanometers and about 240 nanometers at a density of about $2 \times 10^{23}$ atoms/cm$^3$.

A threshold voltage ($V_T$) adjust region 829 is formed by introducing ions into the deep NWELL 823. In one embodiment, the $V_T$ adjust region 829 is formed by implanting boron ions at about 430 keV to a density of about $2 \times 10^{23}$ atoms/cm$^3$ into the deep NWELL 823. The boron ions are preferably implanted to a depth of between about 75 nanometers and about 100 nanometers.

After the blanket threshold voltage ($V_T$) adjust region 829 is formed as described above, a p$^+$ polysilicon layer 831 is formed by a p$^+$ implant into the NWELL region 821 of the polysilicon layer 805. The NWELL region 821 of the polysilicon layer 805 is transformed into a p$^+$ polysilicon layer 831 by introducing a dopant, such as phosphorous, arsenic, or antimony ions, into the polysilicon layer 805. In one embodiment, the p$^+$ polysilicon layer 831 is formed by a blanket implant of phosphorous ions at about 430 keV to a density of about $2 \times 10^{23}$ atoms/cm$^3$. The p$^+$ polysilicon layer 831 can function as a gate in a metal-oxide semiconductor device, such as a PMOS device.

Figure 9A:
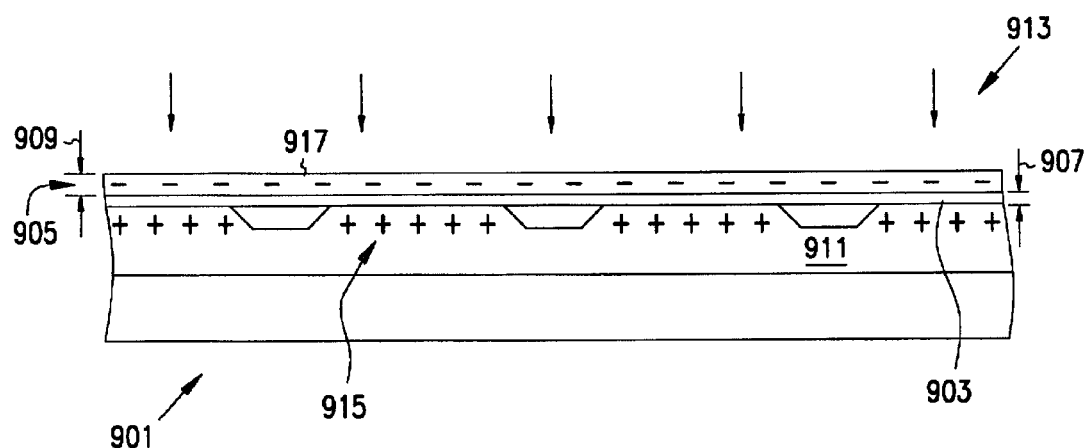
FIGS. 9A–9B illustrate, in a sequence of cross-sectional views, an example embodiment of a dual doped gate circuit structure of the present invention formed using one masking operation after performing a number of blanket implants including an NWELL implant.
Figure 9B:
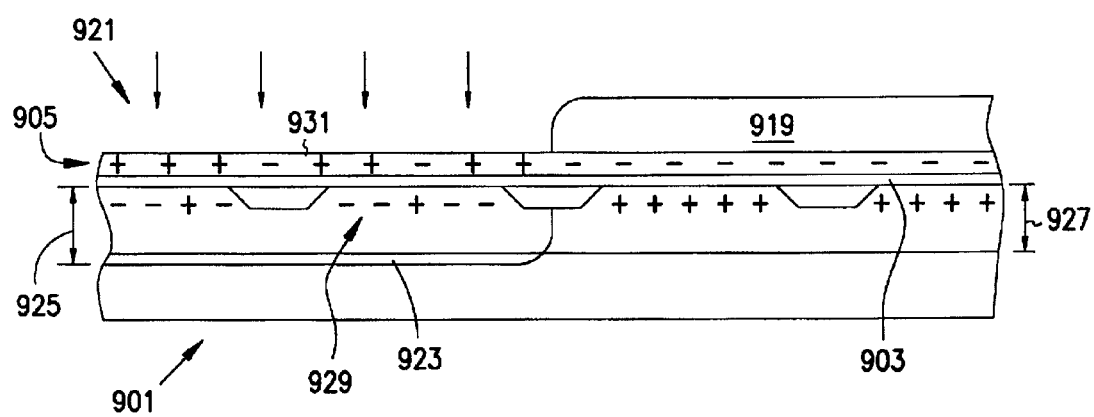

FIGS. 9A–9B illustrate, in a sequence of cross-sectional views, an example embodiment of a dual doped gate circuit structure of the present invention formed using one masking operation after performing a number of blanket implants including an NWELL implant.

FIG. 9A shows a gate oxide layer 903 formed on the substrate 901 and a polysilicon layer 905 formed on the gate oxide layer 903. The gate oxide layer 903 preferably has a thickness 907 of between about five nanometers and about ten nanometers. A thickness of greater than about ten nanometers interferes with the injection of electrons into the polysilicon layer 905, and a thickness of less than about two nanometers unnecessarily increases the probability of voids and fractures in the oxide layer. Since the appropriate thickness for the gate oxide 903 layer depends on the particular integrated circuit device into which the gate oxide layer 903 is incorporated, the thickness 907 of the gate oxide layer 903 is best determined empirically or by modeling.

The polysilicon layer 905 is formed above the gate oxide layer 903 and has a thickness 909 of between about 20 nanometers and about 200 nanometers. The polysilicon layer 905 is typically formed by chemical vapor deposition. The stray capacitance between the polysilicon layer 905 and conductive layers in adjacent devices (not shown) increases as the polysilicon layer thickness 909 increases. For the polysilicon layer 905 having a thickness of more than about 200 nanometers, the stray capacitance between the polysilicon layer 905 and the conductive layers in adjacent devices (not shown) is usually unacceptably high.

An NWELL 911 is formed by a blanket implant of ions into the substrate. The blanket implant introduces ions into the substrate at an exposed substrate surface 913 and does not employ a mask. In one embodiment, the NWELL 911 is formed by a blanket implant of phosphorous ions at about 430 keV into the substrate 901. The phosphorous ions are preferably deposited to a depth of about 200 nanometers at a density of about $2 \times 10^{23}$ atoms/cm$^3$. However, the present invention is not limited to a blanket implant of phosphorous ions. Any implantable material capable of forming an NWELL, when implanted into the substrate 901, is suitable for use in connection with the present invention. A blanket implant is preferable to a masked operation, such as a masked implant, a masked diffusion, or a masked deposition because the blanket implant is less costly.

A blanket threshold voltage ($V_T$) adjust region 915 is formed by a blanket implant into the substrate 901. The $V_T$ adjust region 915 is formed in the NWELL 911 by implanting ions into the NWELL 911. In one embodiment, the $V_T$ adjust region 915 is formed by implanting boron ions at about 430 keV to a density of about $2 \times 10^{23}$ atoms/cm$^3$ into the NWELL 911. The boron ions are preferably implanted to a depth of between about 75 nanometers and about 100 nanometers.

After the blanket threshold voltage ($V_T$) adjust region 915 is formed as described above, a doped or p$^+$ polysilicon layer 917 is formed by a p$^+$ blanket implant into the polysilicon layer 905. The polysilicon layer 905 is transformed into the doped or p$^+$ polysilicon layer 917 by introducing a dopant into the polysilicon layer 905. In one embodiment, the doped or p$^+$ polysilicon layer 917 is formed by a blanket implant of boron ions at about 430 keV to a density of about $2 \times 10^{23}$ atoms/cm$^3$. The doped or p$^+$ polysilicon layer 917 can function as a gate in a metal-oxide semiconductor device, such as an PMOS device.

Referring to FIG. 9B, a resist layer 919 is formed on the polysilicon layer 905. The resist layer 919 is patterned to form a PWELL mask defining one or more PWELL regions 921. In one embodiment, at least one of the one or more PWELL regions 921 has a substantially rectangular shape, when viewed from above (not shown).

A deep PWELL 923 is formed by introducing ions into at least one of the one or more PWELL regions 921. The deep PWELL 923 preferably has a depth 925 greater than a depth 927 of the blanket NWELL 911. In one embodiment, the deep PWELL 923 is formed by implanting boron ions at about 860 keV to a depth of between about 220 nanometers and about 240 nanometers at a density of about $2\times10^{23}$ atoms/cm$^3$.

A threshold voltage ($V_T$) adjust region 929 is formed by introducing ions into the deep NWELL 923. In one embodiment, the $V_T$ adjust region 929 is formed by implanting boron ions at about 430 keV to a density of about $2\times10^{23}$ atoms/cm$^3$ into the deep NWELL 923. The boron ions are preferably implanted to a depth of between about 75 nanometers and about 100 nanometers.

After the blanket threshold voltage ($V_T$) adjust region 929 is formed as described above, an n$^+$ polysilicon layer 931 is formed by an n$^+$ blanket implant into the PWELL region 921 of the polysilicon layer 905. The polysilicon layer 905 is transformed into an n$^+$ polysilicon layer 931 by introducing a dopant into the polysilicon layer 905. In one embodiment, the n$^+$ polysilicon layer 931 is formed by a blanket implant of boron ions at about 430 keV deposited to a density of about $2\times10^{23}$ atoms/cm$^3$. The n$^+$ polysilicon layer 931 can function as a gate in a metal-oxide semiconductor device, such as an NMOS device.

Conclusion

A method of fabricating a dual doped gate structure has been described. The method includes preparing a substrate for fabrication and fabricating a dual doped gate structure on the substrate in a process employing only one mask.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method comprising:

preparing a substrate with only PWELLs; and forming one or more dual gate structures including NWELLS in the substrate using only one mask.

2. The method of claim 1, wherein preparing a substrate comprises:

forming a sacrificial oxide layer on a semiconductor.

3. The method of claim 1, wherein preparing a substrate with only PWELLS comprises:

forming a gate oxide layer on a semiconductor with only PWELLs; and forming a polysilicon layer on the gate oxide layer.

4. The method of claim 1, wherein forming one or more dual gate structures in the substrate using only one mask comprises:

forming a first gate structure having a first conductivity in the substrate, the first gate structure being formed using one or more blanket implants; and forming a second gate structure having a second conductivity in the substrate, the second conductivity having a different value than the first conductivity and the second gate structure being formed using only one masking operation.

5. The method of claim 1, preparing the substrate comprises forming a PWELL in an n-type substrate.

6. The method of claim 1, wherein forming one or more dual gate structures in the substrate using only one mask comprises forming one or more complementary metal-oxide semiconductor dual gate structures in the substrate using only one mask.

7. The method of claim 2, wherein forming the sacrificial oxide layer on the semiconductor comprises growing a sacrificial oxide layer to a depth of a few microns.

8. The method of claim 3, wherein forming the gate oxide layer on the semiconductor comprises forming the gate oxide layer having a thickness of between about five nanometers and about ten nanometers.

9. A method comprising:

preparing a substrate with only NWELLs; and forming one or more dual gate structures including PWELLS in the substrate using only one mask.

10. The method of claim 9, wherein preparing a substrate with only NWELLs comprises:

forming a sacrificial oxide layer on a semiconductor.

11. The method of claim 9, wherein preparing a substrate with only NWELLs comprises:

forming a gate oxide layer on a semiconductor with only NWELLs; and forming a polysilicon layer on the gate oxide layer.

\* \* \* \* \*